United States Patent [19]
Morley

[11] Patent Number: 4,724,296
[45] Date of Patent: Feb. 9, 1988

[54] PLASMA GENERATOR

[76] Inventor: John R. Morley, 54 Golden Ave., Medford, Mass. 02155

[21] Appl. No.: 834,406

[22] Filed: Feb. 28, 1986

[51] Int. Cl.⁴ .............................................. B23K 9/00
[52] U.S. Cl. ...................... 219/121 PT; 219/121 PG; 219/121 PD; 219/121 PE; 156/345; 156/646
[58] Field of Search ................... 219/121 PM, 121 PT, 219/121 PU, 121 PV, 121 EB, 121 PD, 121 EA, 121 PG; 156/646, 643, 345; 204/192 E, 192 N

[56] References Cited
U.S. PATENT DOCUMENTS

| | | | |
|---|---|---|---|
| 4,285,800 | 8/1981 | Welty | 156/345 |
| 4,380,488 | 4/1983 | Reichelderfer et al. | 156/345 |
| 4,381,965 | 5/1983 | Maher, Jr. et al. | 156/345 |

OTHER PUBLICATIONS
IBM Technical Disclosure Bulletin, vol. 21, No. 12, May 1979, Chapman.

Primary Examiner—M. H. Paschall
Attorney, Agent, or Firm—Wolf, Greenfield & Sacks

[57] ABSTRACT

A multi-electrode plasma generator is arranged with each electrode held at a potential with respect to ground that is a fraction of the breakdown potential so that no spurious discharges to ground are possible. The potential between electrodes exceeds the breakdown potential so that plasma is generated between electrodes. The generated plasma is thus contained between the electrodes, resulting in a more uniform plasma and better power efficiency.

18 Claims, 4 Drawing Figures

4,724,296

PLASMA GENERATOR

FIELD OF THE INVENTION

This invention relates to apparatus for generating electrical plasma in a vacuum.

BACKGROUND OF THE INVENTION

Present vacuum plasma processing operations are generally performed in vacuum vessels at pressures in the range of 20 Torr or less, typically with pressures of a few microns (10 microns to 1000 microns). Two or more electrodes are mounted in the vessel and connected to a high-voltage power supply. A plasma is formed between the electrodes when a voltage exceeding the breakdown voltage is applied between the electrodes.

Although the voltages of plasma discharges may vary considerably according to gas species and the product of gas pressure and distance between electrodes (in accordance with the well-known Paschen Curve), in actual practice, most commercial discharge apparatus operate with power supplies having voltages in the range of a few hundred to a few thousand volts. However, even these voltages can constitute a hazard to operating personnel in the vicinity of the apparatus, especially since the vacuum vessels in which the discharges occur are often electrically conductive.

Consequently, for reasons of safety, the vacuum vessels are conventionally connected to ground potential. Most often the parts being processed are also connected to ground potential, although in some instances the parts are biased to a potential for certain process operations.

The power supply which energizes the electrodes and maintains the plasma discharge may be a direct current supply or may be an alternating current supply varying in frequency from a few Hertz to many megaHertz. However, in the case of both D.C. and A.C. supplies, it is the usual procedure to ground one electrode and connect the other electrode to the power supply. One side of the power supply is generally connected to ground potential while the other side is at a preset voltage with respect to ground.

There has been a problem with prior plasma generating apparatus due to the potential between the vessel walls and the high-voltage electrodes. In particular, when a plasma discharge is started between two electrodes (one of which is at ground potential and the other which is at a potential with respect to ground), the plasma may not be totally contained between the electrodes. In many instances a "stray" plasma discharge also forms between the high-voltage electrode and the vessel walls and between the lead-in wire to the high-voltage electrode and the vessel walls (at the power feedthrough into the vessel).

Such stray discharges waste processing power since the discharge is not contained between the electrodes and thus does not contribute actively to the process. In many instances thermal "hot spots" can be found on the vacuum vessel walls where stray, non-uniform discharges have occurred.

Accordingly, it is an object of the present invention to provide plasma discharge apparatus in which spurious discharges are eliminated.

It is another object of the present invention to provide plasma discharge apparatus in which discharges are confined mainly to the area between electrodes.

It is a further object of the present invention to provide plasma discharge apparatus which avoids the conventional loss of power due to spurious discharges.

It is still another object of the present invention to provide plasma discharge apparatus in which a more uniform plasma is obtained.

SUMMARY OF THE INVENTION

The foregoing objects are achieved and the foregoing problems are solved in one illustrative embodiment of the invention in which the vacuum vessel walls are maintained at a voltage potential which is safe for operating personnel (for example, ground potential). A different electrode wiring scheme is used whereby each electrode is at a voltage potential with respect to the vessel potential which is less than the breakdown potential of the vacuum medium. More specifically, at least one electrode is at a positive voltage with respect to vessel potential which is less than the breakdown potential. At least one other electrode is at a negative potential with respect to the vessel potential which is less than the breakdown potential. Since the potentials between the electrodes and the vessel is less than the breakdown potential, no discharge occurs between the electrodes and the vessel.

However, the potential of one electrode with respect to another electrode can exceed the breakdown potential and thus a plasma can be formed between the electrodes.

DETAILED DESCRIPTION OF THE PREFERRED EMBODIMENT

Figure 1:
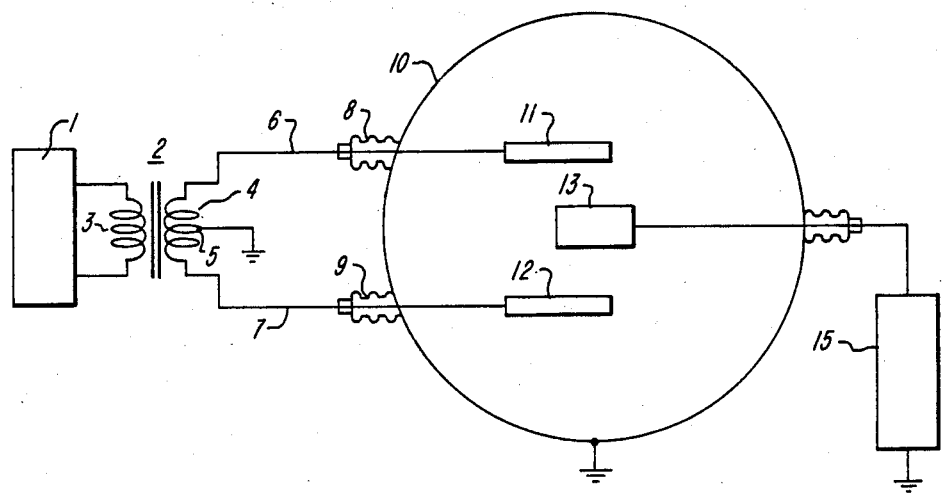
FIG. 1 shows the electrical arrangement of the inventive plasma generator.

An illustrative embodiment of the invention is shown in FIG. 1. The plasma generator consists of a power supply 1 which establishes electrical potentials on two electrodes 1,2. Power supply 1 may be a direct current supply or may be an alternating current supply with a frequency ranging from a few Hertz to may megahertz. The output of supply 1 is provided to the primary winding 3 of transformer 2. Transformer 2 may convert the output of power supply 1 to a convenient value for processing or may simply act as an isolator in accordance with the invention. Transformer 2 has a secondary winding 4 which is tapped at point 5 (point 5 may be a center tap or some other tap). Each end of the secondary winding 4 of transformer 2 is connected to one of electrodes 11 and 12 via leads 6 and 7.

Electrodes 11 and 12 are housed in a vacuum vessel (shown schematically as vessel 10) in which the pressure is reduced so that an electrical plasma can be formed. The electrical leads, 6 and 7, connecting secondary winding 4 to electrodes 11 and 12 pass through conventional feedthroughs 8 and 9, respectively.

A voltage reference is provided to the transformer by connecting tap 5 to the vessel potential, in this case, ground. Alternatively, for convenience in processing, both vessel 10 and the transformer tap 5 may maintained at two other potentials with respect to ground, which other potentials need not be equal to ground or each other.

With this connection, the full output voltage of the transformer secondary winding 4 appears across electrodes 11 and 12, but only a fraction of that voltage appears between the vessel and either electrode. If the voltage generated across transformer secondary winding 4 is chosen to be above the breakdown voltage of the vessel medium, a discharge will occur between electrodes 11 and 12. However, no discharge to the vessel walls 10 or ground is now possible because the potential between the electrodes and ground is only a fraction of the breakdown voltage.

Since the preferred path of the discharge is now only between the electrodes, the plasma is contained and formed in the shape of the electrodes and stray discharges are eliminated.

The tapped transformer described above is one illustrative way of dividing the discharge potential between the electrodes, and is not intended to be limiting on the claims herein. Many other methods, such as resistive or inductive dividers are well-known and can be used with the invention.

Similarly, the voltage between the discharge electrodes and the vessel potential need not be exactly one-half of the voltage across the electrodes to eliminate stray discharges to the vessel walls - any voltage division will accomplish the invention objective providing that the breakdown potential is not reached between one electrode and the vessel walls.

Also shown in FIG. 1 is a workpiece 13 disposed in vessel 10. In accordance with process requirements, workpiece 13 can be electrically floating, or held at another potential by power supply 15.

Figure 2:
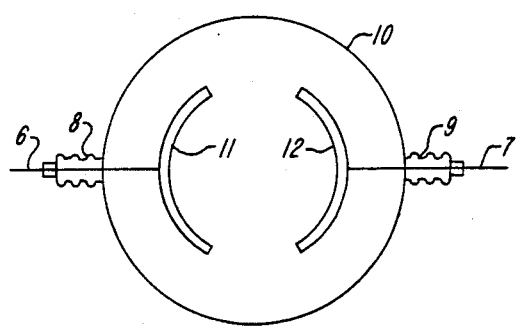
FIG. 2 shows alternative electrode arrangements.
Figure 3:
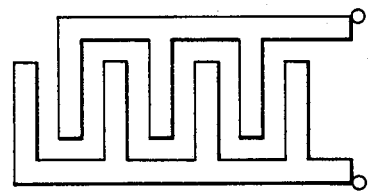
FIG. 3 shows a multiple electrode configuration.

When the inventive electrode connection is used, plasma is contained within the electrode structure and may be shaped by the electrode configuration. Thus various plasma shapes may be obtained by using flat or curved electrodes or multiple electrodes. FIG. 2 shows such a curved electrode configuration (numbering corresponds to FIG. 1). A multiple electrode configuration is shown in FIG. 3.

Figure 4:
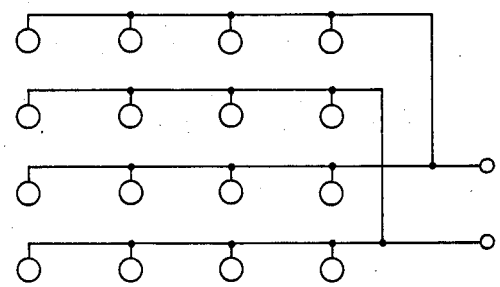
FIG. 4 shows a cooled electrode arrangement.

In addition, some degree of temperature control can be achieved by heating or cooling the electrodes by means of a heat transfer fluid and hollow electrodes. A cooled electrode arrangement with hollow electrodes is shown in FIG. 4. Other electrode arrangements (not shown) may illustratively be used in accordance with the invention.

What is claimed is:

1. A method for generating an electrical plasma in a plasma processing system for processing work pieces within a vacuum vessel containing a processing medium, said system having at least two electrodes for generating a plasma and a power supply for establishing a potential across said electrodes to form said plasma, said method comprising the steps of:
   A. establishing a first electrical potential with respect to a reference potential on a first one of said electrodes,
   B. establishing an second electrical potential with respect to a reference potential on a second one of said electrodes, the difference between the value of said first potential and the value of said second potential exceeding the breakdown potential of the said processing medium in said vessel, and
   C. maintaining the potential of said vessel relative to said reference potential at a value between said first potential and said second potential so that the electrical potential between said vessel and said electrodes is less than said breakdown potential.

2. A method for generating an electrical plasma in accordance with claim 1 wherein the potential between said first and said second electrodes is only slightly more than said breakdown potential and step C further comprises the steps of:
   C'. maintaining the potential of said vessel relative to said reference potential at a value substantially halfway between said first potential and said second potential so that the electrical potential between said vessel and said electrodes is less than said breakdown potential.

3. Apparatus for generating an electrical plasma in a plasma processing system for processing work pieces within a vacuum vessel, said system having at least two electrodes for generating a plasma, said apparatus comprising,
   first power supply means for establishing a first electrical potential with respect to a reference potential on a first one of said electrodes,
   second power supply means establishing a second electrical potential with respect to a reference potential on a second one of said electrodes, the difference between the value of said first potential and the value of said second potential exceeding the breakdown potential in said vessel, and
   third power supply means for maintaining the potential of said vessel relative to said reference potential at a value between said first potential and said second potential so that the electrical potential between said vessel and said electrodes is less than said breakdown potential.

4. Apparatus for generating an electrical plasma in accordance with claim 3 wherein the potential between said first and said second electrodes is only slightly more than said breakdown potential and said third power supply means maintains the potential of said vessel relative to said reference potential at a value substantially halfway between said first potential and said second potential so that the electrical potential between said vessel and said electrodes is less than said breakdown potential.

5. Apparatus for generating an electrical plasma in accordance with claim 3 wherein said first electrode and said second electrode are curved to shape said plasma.

6. Apparatus for generating an electrical plasma in accordance with claim 3 wherein said processing system includes more than three or more electrodes.

7. Apparatus for generating an electrical plasma in accordance with claim 3 further comprising fourth power supply means for maintaining at least one of said work pieces at a fourth potential relative to said reference potential.

8. Apparatus for generating an electrical plasma in accordance with claim 3 wherein said first and second power supply means are alternating current power supplies.

9. Apparatus for generating an electrical plasma in a plasma processing system for processing work pieces within a vacuum vessel, said system having at least two electrodes for generating a plasma, said apparatus comprising,
   power supply means for establishing an first electrical potential with respect to a reference potential on a first one of said electrodes, said first potential exceeding the breakdown potential in said vessel, first means for dividing said first potential down to generate a second electrical potential with respect to a reference potential on a second one of said electrodes, the difference between the value of said first potential and the value of said second potential exceeding the breakdown potential in said vessel, and second means for dividing said first potential down to generate a third potential on said vessel relative to said reference potential at a value between said first potential and said second potential so that the electrical potential between said vessel and said electrodes is less than said breakdown potential.

10. Apparatus for generating an electrical plasma in accordance with claim 9 wherein the potential between said first and said second electrodes is only slightly more than said breakdown potential and second dividing means maintains the potential of said vessel relative to said reference potential at a value halfway between said first potential and said second potential so that the electrical potential between said vessel and said electrodes is less than said breakdown potential.

11. Apparatus for generating an electrical plasma in accordance with claim 9 wherein said first electrode and said second electrode are curved to shape said plasma.

12. Apparatus for generating an electrical plasma in accordance with claim 9 wherein said processing system includes more than three or more electrodes.

13. Apparatus for generating an electrical plasma in accordance with claim 9 further comprising a second power supply means for maintaining at least one of said work pieces at a fourth potential relative to said reference potential.

14. Apparatus for generating an electrical plasma in accordance with claim 9 wherein said first and second power supply means are alternating current power supplies.

15. Apparatus for generating an electrical plasma in a plasma processing system for processing work pieces within a vacuum vessel, said system having at least two electrodes for generating said plasma, said apparatus comprising, a transformer having a tapped secondary winding, said transformer generating across its secondary winding a first electrical potential exceeding the breakdown potential in said vessel, first means for attaching one of said electrodes to one end of said secondary winding, second means for attaching another of said electrodes to the other end of said secondary winding, third means for attaching said vessel to said tap so that the electrical potential between said vessel and said electrodes is less than said breakdown potential.

16. Apparatus for generating an electrical plasma in accordance with claim 15 wherein said tap is a center tap.

17. Apparatus for generating an electrical plasma in accordance with claim 15 wherein said processing system includes more than three or more electrodes.

18. Apparatus for generating an electrical plasma in accordance with claim 15 further comprising a power supply for maintaining at least one of said work pieces at a potential relative to said vessel.

* * * * *